United States Patent
Tanaka et al.

(10) Patent No.: US 11,588,442 B2
(45) Date of Patent: Feb. 21, 2023

(54) POWER AMPLIFIER CIRCUIT

(71) Applicant: Murata Manufacturing Co., Ltd., Kyoto (JP)

(72) Inventors: Satoshi Tanaka, Kyoto (JP); Satoshi Arayashiki, Kyoto (JP); Kenji Mukai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 34 days.

(21) Appl. No.: 17/085,228

(22) Filed: Oct. 30, 2020

(65) Prior Publication Data

US 2021/0135630 A1      May 6, 2021

(30) Foreign Application Priority Data

Nov. 5, 2019    (JP) .............................. JP2019-200941

(51) Int. Cl.
*H03F 1/30*    (2006.01)
*H03F 1/02*    (2006.01)
(Continued)

(52) U.S. Cl.
CPC ........... *H03F 1/0222* (2013.01); *H03F 3/195* (2013.01); *H03F 3/245* (2013.01); *H03F 2200/102* (2013.01); *H03F 2200/451* (2013.01)

(58) Field of Classification Search
CPC ...................................................... H03F 1/30
(Continued)

(56) References Cited

U.S. PATENT DOCUMENTS

| | | | |
|---|---|---|---|
| 6,313,695 B1 * | 11/2001 | Ooishi ................... | G11C 5/144 326/82 |
| 6,873,208 B2 * | 3/2005 | Shinjo ..................... | H03F 3/193 330/136 |

(Continued)

FOREIGN PATENT DOCUMENTS

| JP | 2003-037446 A | 2/2003 |
|---|---|---|
| JP | 2018037839 A | 3/2018 |

OTHER PUBLICATIONS

Ji-Seon Paek et al., "15.1 An 88%-Efficiency Supply Modulator Achieving 1.08 μs/V Fast Transition and 100 MHz Envelope-Tracking Bandwidth for 5G New Radio RF Power Amplifier", Session 15 Overview: Power for 5G, Wireless Power, and GaN Converters, Power Management Subcommittee, 2019 IEEE International Solid-State Circuits Conference, Digest of Technical Papers, Feb. 19, 2019, pp. 238-240.

*Primary Examiner* — Henry Choe
(74) *Attorney, Agent, or Firm* — Pearne & Gordon LLP

(57) ABSTRACT

A power amplifier circuit includes a first power supply terminal electrically connected to a first power amplifier; a second power supply terminal electrically connected to a second power amplifier subsequent to the first power amplifier; a first external power supply line configured to electrically connect a power supply circuit configured to output a power supply potential corresponding to an amplitude level of a high-frequency input signal and the first power supply terminal; and a second external power supply line configured to electrically connect the power supply circuit and the second power supply terminal. An inductance value of the first external power supply line is higher than an inductance value of the second external power supply line.

16 Claims, 13 Drawing Sheets

(51) Int. Cl.
 *H03F 3/195* (2006.01)
 *H03F 3/24* (2006.01)
(58) Field of Classification Search
 USPC .................................................. 330/129, 297
 See application file for complete search history.

(56) References Cited

U.S. PATENT DOCUMENTS

| | | | |
|---|---|---|---|
| 8,653,891 B2 * | 2/2014 | Ubbesen | H03G 3/3047 330/297 |
| 10,291,184 B1 * | 5/2019 | Sutskover | H03F 3/245 |
| 10,826,435 B2 * | 11/2020 | Seong | H03F 1/0266 |
| 2004/0124928 A1 | 7/2004 | Karasudani | |
| 2018/0062578 A1 | 3/2018 | Sato et al. | |

* cited by examiner

POWER AMPLIFIER CIRCUIT

CROSS REFERENCE TO RELATED APPLICATION

This application claims priority from Japanese Patent Application No. 2019-200941 filed on Nov. 5, 2019. The content of this application is incorporated herein by reference in its entirety.

BACKGROUND

The present disclosure relates to a power amplifier circuit. In a power amplifier circuit installed in a wireless communication terminal device, reductions in power consumption are necessary. As one method of reducing power consumption, there is an envelope tracking method in which a power supply potential of the power amplifier circuit is controlled in accordance with an amplitude level of a high-frequency signal.

Japanese Unexamined Patent Application Publication No. 2018-37839 discloses a technique in which, in each of power amplifiers connected in multiple stages, a difference between the phase of a high-frequency signal and the phase of a power supply potential is reduced. Specifically, Japanese Unexamined Patent Application Publication No. 2018-37839 discloses a technique in which, of the power amplifiers connected in multiple stages, the phase of a power supply potential of a subsequent-stage power amplifier is delayed.

The fourth generation mobile communication systems (4G, such as long term evolution (LTE) and LTE-Advanced) are currently being implemented. Furthermore, the fifth generation mobile communication system (5G) is being put to practical use.

In the 4G, a frequency band of an envelope tracking modulated signal (power supply potential) ranges from 10 MHz to 20 MHz and ranges from 30 MHz to 40 MHz at the maximum. On the other hand, in the 5G, a frequency band of a power supply potential is asked to be up to 100 MHz or more as described in Ji-Seon Paek, and other 13 authors, "15.1 An 88%-Efficiency Supply Modulator Achieving 1.08 μs/V Fast Transition and 100 MHz Envelope-Tracking Bandwidth for 5G New Radio RF Power Amplifier", 2019 IEEE International Solid-State Circuits Conference, DIGEST OF TECHNICAL PAPERS, Feb. 19, 2019, pp. 238-239.

Thus, since the frequency band of the power supply potential in the 5G is wider than that in the 4G, it is conceivable that the technique disclosed in Japanese Unexamined Patent Application Publication No. 2018-37839 has difficulty in dealing with the frequency band of the power supply in the 5G. Specifically, in a previous-stage power amplifier of the power amplifiers connected in multiple stages, the phase of a power supply potential may get ahead of the phase of a high-frequency signal. As a result, there is a possibility that distortion may occur in the high-frequency signal.

BRIEF SUMMARY

In view of the above, the present disclosure has been made and reduces a possibility that distortion may occur in a high-frequency signal.

A power amplifier circuit according to one aspect of the present disclosure includes a plurality of power amplifiers connected in multiple stages and configured to amplify a high-frequency input signal and output an amplified high-frequency output signal; a first power supply terminal electrically connected to a first power amplifier of the plurality of power amplifiers; a second power supply terminal electrically connected to a second power amplifier subsequent to the first power amplifier of the plurality of power amplifiers; a first external power supply line configured to electrically connect a power supply circuit configured to output a power supply potential corresponding to an amplitude level of the high-frequency input signal and the first power supply terminal; and a second external power supply line configured to electrically connect the power supply circuit and the second power supply terminal. An inductance value of the first external power supply line is higher than an inductance value of the second external power supply line.

A power amplifier circuit according to one aspect of the present disclosure includes a plurality of power amplifiers connected in multiple stages and configured to amplify a high-frequency input signal and output an amplified high-frequency output signal; a power supply terminal configured to receive a power supply potential corresponding to an amplitude level of the high-frequency input signal; a first internal power supply line configured to electrically connect a first power amplifier of the plurality of power amplifiers and the power supply terminal; and a second internal power supply line configured to electrically connect a second power amplifier subsequent to the first power amplifier of the plurality of power amplifiers and the power supply terminal. An inductance value of the first internal power supply line is higher than an inductance value of the second internal power supply line.

A power amplifier circuit according to one aspect of the present disclosure includes a plurality of power amplifiers connected in multiple stages and configured to amplify a high-frequency input signal and output an amplified high-frequency output signal; a second power supply terminal configured to receive a power supply potential corresponding to an amplitude level of the high-frequency input signal; a second internal power supply line having one end electrically connected to the second power supply terminal and another end electrically connected to a second power amplifier of the plurality of power amplifiers; and a first internal power supply line having one end electrically connected to the other end of the second internal power supply line and another end electrically connected to a first power amplifier previous to the second power amplifier of the plurality of power amplifiers.

The present disclosure enables a reduction in the possibility that distortion may occur in a high-frequency signal.

Other features, elements, characteristics and advantages of the present disclosure will become more apparent from the following detailed description of embodiments of the present disclosure with reference to the attached drawings.

DETAILED DESCRIPTION

Embodiments of a power amplifier circuit according to the present disclosure will be described in detail below with reference to the drawings. Note that the present disclosure is not to be limited by these embodiments. Each embodiment is merely illustrative, and it goes without saying that configurations described in different embodiments can be partially replaced or combined. In second and subsequent embodiments, a description of things in common with a first embodiment is omitted, and only respects in which the second and subsequent embodiments differ from the first embodiment will be described. In particular, similar function effects achieved by similar configurations are not repeatedly described in each embodiment.

First Embodiment

Although a first embodiment will be described below, a comparative example will be described first to facilitate understanding of the first embodiment.

Comparative Example

Figure 1:
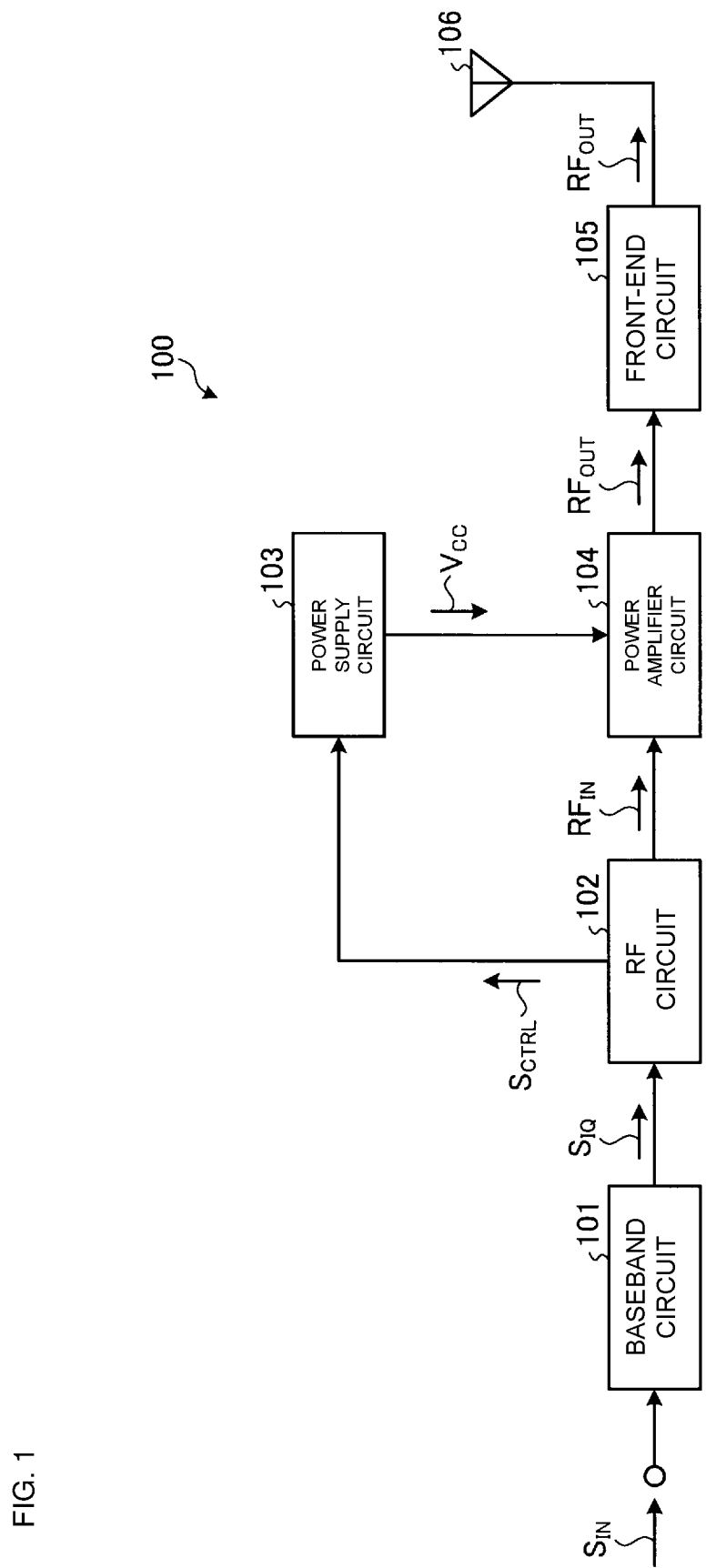
FIG. 1 illustrates a configuration of a transmission circuit including a power amplifier circuit according to a comparative example.

FIG. 1 illustrates a configuration of a transmission circuit including a power amplifier circuit according to a comparative example. A transmission circuit 100 is used, for example, in a wireless communication terminal device, such as a mobile phone device, to transmit various signals, such as voice and data, to a base station. Incidentally, although the wireless communication terminal device includes a reception unit as well that receives a signal from the base station, a description of the reception unit is omitted herein.

As illustrated in FIG. 1, the transmission circuit 100 includes a baseband circuit 101, a radio frequency (RF) circuit 102, a power supply circuit 103, a power amplifier circuit 104, a front-end circuit 105, and an antenna 106.

The baseband circuit 101 modulates an input signal $S_{IN}$, such as voice or data, in accordance with a modulation scheme for high speed uplink packet access (HSUPA), LTE, or the like and outputs a modulated signal $S_{IQ}$. The modulated signal $S_{IQ}$ is an IQ signal (an in-phase (I) signal and a quadrature (Q) signal) whose amplitude and phase are represented in an IQ plane.

The RF circuit 102 outputs a high-frequency input signal $RF_{IN}$ in accordance with the modulated signal $S_{IQ}$ output from the baseband circuit 101. Furthermore, the RF circuit 102 detects an amplitude level of the modulated signal $S_{IQ}$ in accordance with the modulated signal $S_{IQ}$. Then, the RF circuit 102 outputs, to the power supply circuit 103, a control signal $S_{CTRL}$ that controls the power supply circuit 103 so that a power supply potential $V_{CC}$ to be supplied to the power amplifier circuit 104 reaches a level corresponding to an amplitude level of the high-frequency input signal $RF_{IN}$. Specifically, the RF circuit 102 outputs, to the power supply circuit 103, the control signal $S_{CTRL}$ that controls the power supply circuit 103 so that the power supply potential $V_{CC}$ reaches a level corresponding to an envelope of the high-frequency input signal $RF_{IN}$. In other words, the RF circuit 102 outputs the control signal $S_{CTRL}$ for performing envelope tracking to the power supply circuit 103.

Incidentally, in the RF circuit 102, direct conversion from the modulated signal $S_{IQ}$ to the high-frequency input signal $RF_{IN}$ is not performed, the modulated signal $S_{IQ}$ is converted to an intermediate frequency (IF) signal, and the high-frequency input signal $RF_{IN}$ may be generated from the IF signal.

The power supply circuit 103 is an envelope tracking power supply circuit that generates a power supply potential $V_{CC}$ having a level corresponding to the control signal $S_{CTRL}$ output from the RF circuit 102, that is, a power supply potential $V_{CC}$ having a level corresponding to the envelope of the high-frequency input signal $RF_{IN}$ and outputs the power supply potential $V_{CC}$ to the power amplifier circuit 104. The power supply circuit 103 can be constituted, for example, by a direct current to direct current (DC-DC) converter that generates a power supply potential $V_{CC}$ having a level corresponding to the control signal $S_{CTRL}$ from an input voltage.

The power amplifier circuit 104 amplifies the power of the high-frequency input signal $RF_{IN}$ output from the RF circuit 102 to a level suitable to transmit the high-frequency input signal $RF_{IN}$ to the base station. Subsequently, the power amplifier circuit 104 outputs an amplified high-frequency output signal $RF_{OUT}$ to the front-end circuit 105.

The front-end circuit 105 performs filtering on the high-frequency output signal $RF_{OUT}$, switching between the high-frequency output signal $RF_{OUT}$ and a reception signal received from the base station, and so forth. The high-frequency output signal $RF_{OUT}$ output from the front-end circuit 105 is transmitted to the base station through the antenna 106.

Figure 2:
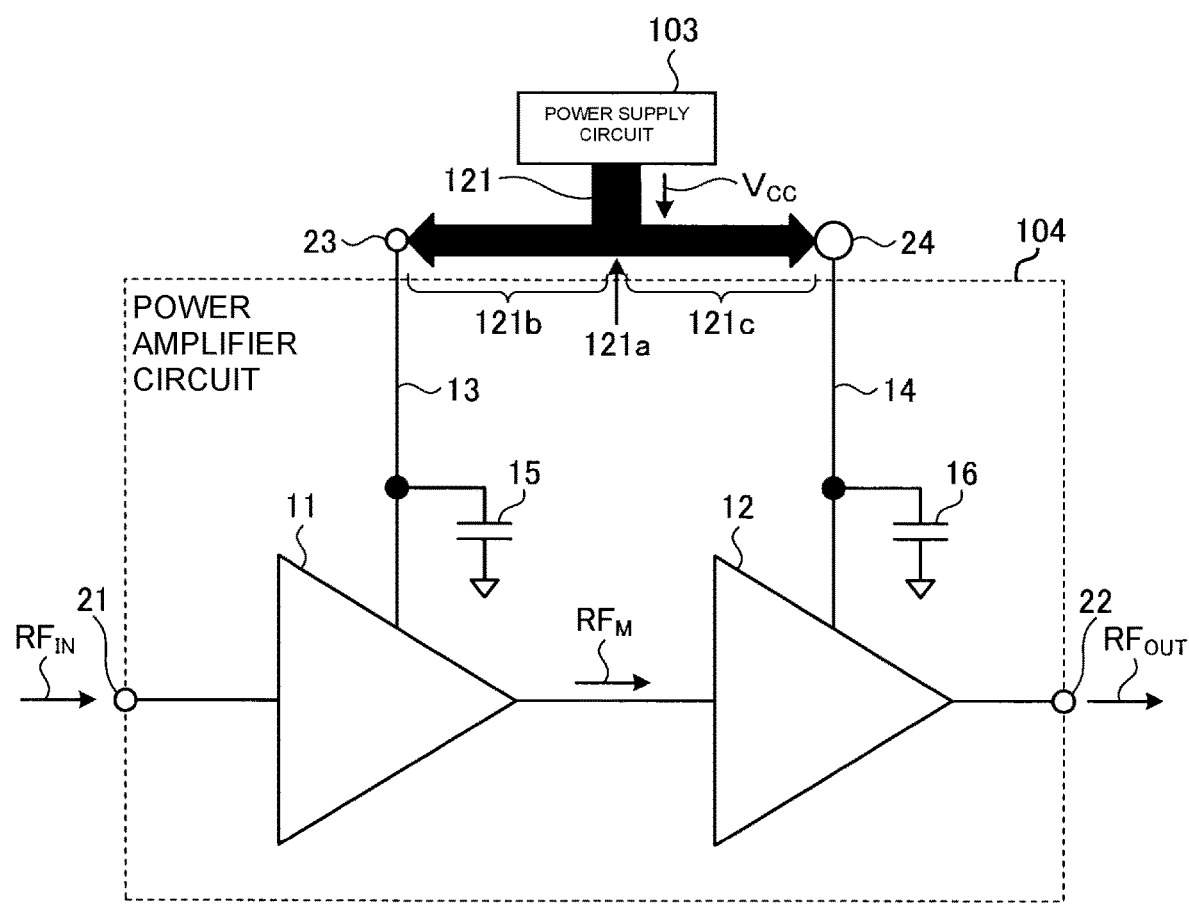
FIG. 2 illustrates a circuit configuration of the power amplifier circuit according to the comparative example.

FIG. 2 illustrates a circuit configuration of the power amplifier circuit according to the comparative example. The power amplifier circuit 104 includes a first-stage first power amplifier 11 and a final-stage second power amplifier 12. Although the power amplifier circuit 104 may be implemented by a hybrid integrated circuit (which may be referred to as a module) in which a plurality of components (semiconductor integrated circuits and so forth) are mounted on one substrate, the present disclosure is not limited to this.

Furthermore, although the power amplifier circuit 104 includes two stages of power amplifiers that are the first power amplifier 11 and the second power amplifier 12, the present disclosure is not limited to this. The power amplifier circuit 104 may include three or more stages of power amplifiers. For example, the power amplifier circuit 104 may further include one or more power amplifiers inserted between the first power amplifier 11 and the second power amplifier 12.

The first power amplifier 11 may be referred to as a first stage or drive stage. The second power amplifier 12 may be referred to as a final stage or power stage.

Figure 3:
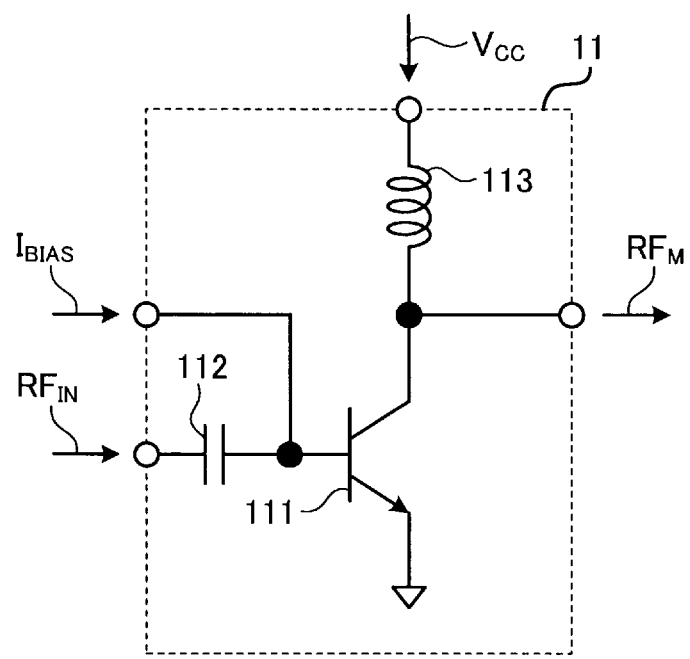
FIG. 3 illustrates a circuit configuration of a power amplifier in the power amplifier circuit according to the comparative example.

FIG. 3 illustrates a circuit configuration of a power amplifier in the power amplifier circuit according to the comparative example. The first power amplifier 11 includes a transistor 111, a capacitor 112, and an inductor 113.

In the present disclosure, although a transistor is a bipolar transistor, the present disclosure is not limited to this. Although, as an example of the bipolar transistor, a heterojunction bipolar transistor (HBT) is given, the present disclosure is not limited to this. The transistor may be, for example, a field-effect transistor (FET). The transistor may be a multi-finger transistor including a plurality of unit transistors (also referred to as fingers) electrically connected in parallel. A unit transistor refers to a minimum component constituting the transistor.

An emitter of the transistor 111 is electrically connected to a reference potential. Although, as an example of the reference potential, a ground potential is given, the present disclosure is not limited to this.

A collector of the transistor 111 is electrically connected to one end of the inductor 113. The power supply potential $V_{CC}$ is input to the other end of the inductor 113. The inductor 113 supplies the power of the power supply potential $V_{CC}$ to the collector of the transistor 111. A collector current flows from the power supply potential $V_{CC}$ to the collector of the transistor 111 through the inductor 113.

Assume that the inductor 113 has a sufficiently high impedance for a frequency band of the high-frequency input signal $RF_{IN}$. That is, in considering the frequency band of the high-frequency input signal $RF_{IN}$, the impedance of the inductor 113 is negligible. Furthermore, the inductor 113 keeps the high-frequency input signal $RF_{IN}$ from coupling to the power supply circuit 103. In other words, the inductor 113 serves as a choke inductor.

The high-frequency input signal $RF_{IN}$ is input to a base of the transistor 111 through the capacitor 112. Furthermore, a bias current $I_{BIAS}$ is input to the base of the transistor 111.

In the transistor 111, an electrical bias state is set by the bias current $I_{BIAS}$. The transistor 111 outputs, from the collector to the second power amplifier 12, a high-frequency signal $RF_M$ obtained by performing power amplification on the high-frequency input signal $RF_{IN}$.

A circuit configuration of the second power amplifier 12 is similar to that of the first power amplifier 11, and illustration and description thereof are thus omitted.

Referring back to FIG. 2, the high-frequency input signal $RF_{IN}$ is input to the first power amplifier 11 through a high-frequency signal input terminal 21. One end of a first internal power supply line 13 is electrically connected to a first power supply terminal 23. The other end of the first internal power supply line 13 is electrically connected to the first power amplifier 11 (the other end of the inductor 113 (see FIG. 3)). The power supply potential $V_{CC}$ is input to the first power amplifier 11 through the first power supply terminal 23 and the first internal power supply line 13. One end of a capacitor 15 is electrically connected to the first power amplifier 11 (the other end of the inductor 113). The other end of the capacitor 15 is electrically connected to the reference potential. The first power amplifier 11 outputs the amplified high-frequency signal $RF_M$ to the second power amplifier 12.

The high-frequency signal $RF_M$ is input from the first power amplifier 11 to the second power amplifier 12. One end of a second internal power supply line 14 is electrically connected to a second power supply terminal 24. The other end of the second internal power supply line 14 is electrically connected to the second power amplifier 12. The power supply potential $V_{CC}$ is input to the second power amplifier 12 through the second power supply terminal 24 and the second internal power supply line 14. One end of a capacitor 16 is electrically connected to the second power amplifier 12. The other end of the capacitor 16 is electrically connected to the reference potential. The second power amplifier 12 outputs the amplified high-frequency output signal $RF_{OUT}$ to the front-end circuit 105 through a high-frequency signal output terminal 22.

The power supply circuit 103 is electrically connected to the first power supply terminal 23 and the second power supply terminal 24 using an external power supply line 121. One end of the external power supply line 121 is electrically connected to the power supply circuit 103. On another end side of the external power supply line 121, a division has been made into a first external power supply line 121b and a second external power supply line 121c at a branch portion 121a. A tip portion of the first external power supply line 121b is electrically connected to the first power supply terminal 23. A tip portion of the second external power supply line 121c is electrically connected to the second power supply terminal 24.

In the present disclosure, although the first external power supply line 121b and the second external power supply line 121c are integrally formed, the present disclosure is not limited to this. The first external power supply line 121b and the second external power supply line 121c may be separately formed and connected together. Furthermore, the first external power supply line 121b and the second external power supply line 121c do not have to be connected together. In other words, each of the other end portion of the first external power supply line 121b and the other end portion of the second external power supply line 121c may be directly connected to the power supply circuit 103.

Figure 4:
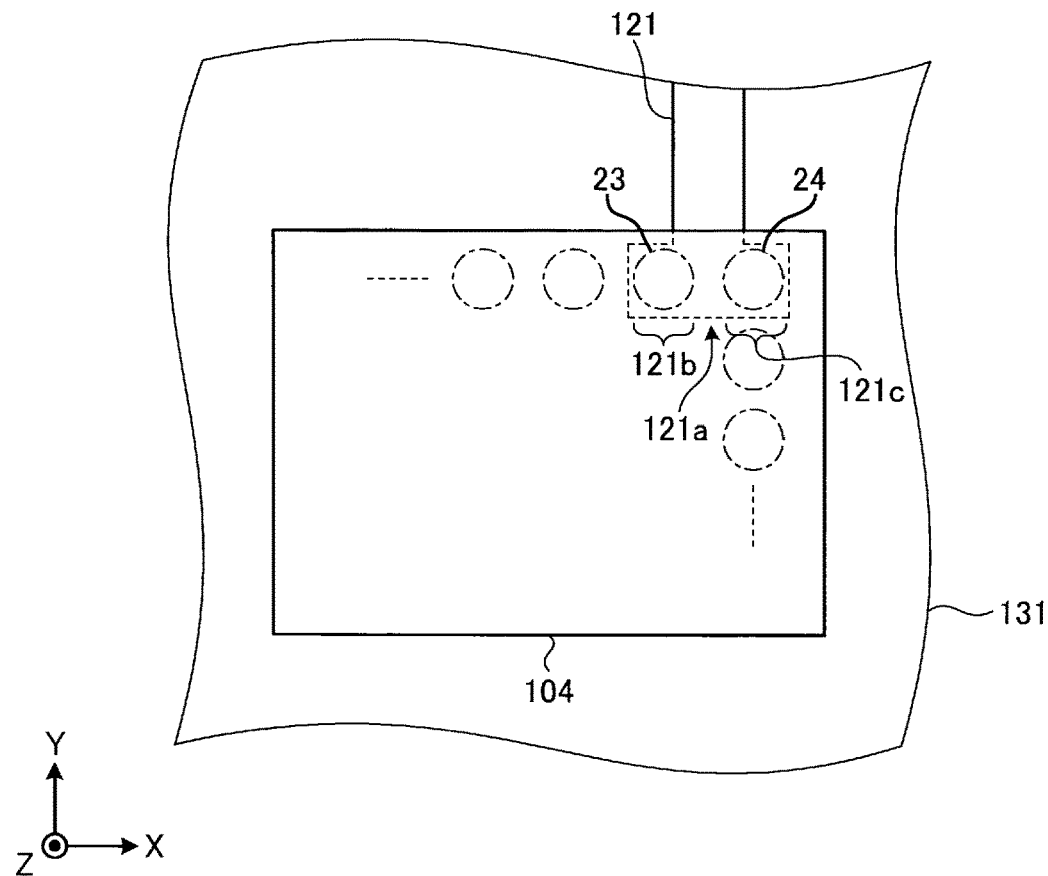
FIG. 4 illustrates the power amplifier circuit according to the comparative example.

FIG. 4 illustrates the power amplifier circuit according to the comparative example. Specifically, FIG. 4 illustrates the power amplifier circuit 104 that is a semiconductor integrated circuit (IC) mounted on a substrate 131 as viewed from above.

On the substrate 131, the external power supply line 121 is formed. The external power supply line 121 is divided into the first external power supply line 121b and the second external power supply line 121c at the branch portion 121a.

On a lower surface of the power amplifier circuit 104 (a surface opposite to the substrate 131), the first power supply terminal 23 and the second power supply terminal 24 are provided. The first power supply terminal 23 is electrically connected to the first external power supply line 121b. The second power supply terminal 24 is electrically connected to the second external power supply line 121c.

The width of the first external power supply line 121b and the width of the second external power supply line 121c are substantially the same. Furthermore, the length of the first external power supply line 121b and the length of the second external power supply line 121c are substantially the same. Hence, an inductance value of the first external power supply line 121b and an inductance value of the second external power supply line 121c are substantially the same.

In FIG. 4, although the first power supply terminal 23 and the second power supply terminal 24 are provided at a corner portion of the power amplifier circuit 104 that is the semiconductor integrated circuit, the present disclosure is not limited to this. The first power supply terminal 23 and the second power supply terminal 24 may be provided at a place (for example, a middle portion of a side) other than the corner portion of the power amplifier circuit 104. Furthermore, although the first power supply terminal 23 and the second power supply terminal 24 are arranged next to each other, the present disclosure is not limited to this. Another terminal (for example, a ground terminal) may be provided between the first power supply terminal 23 and the second power supply terminal 24.

Figure 5:
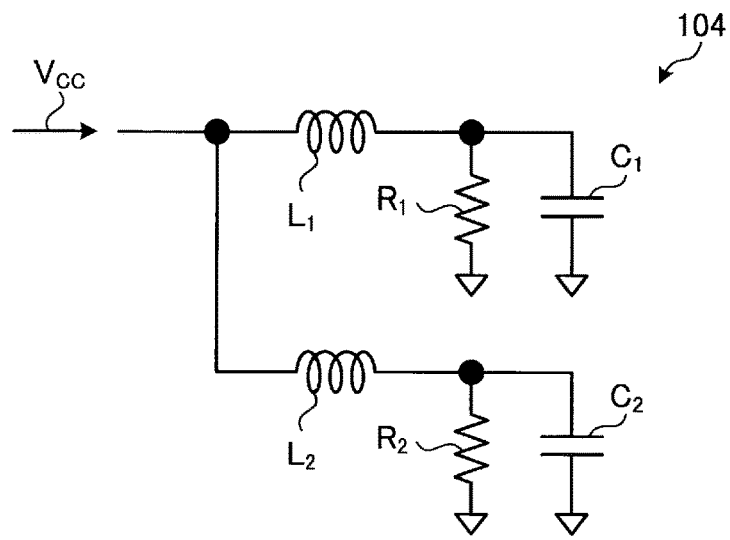
FIG. 5 illustrates an equivalent circuit of the power amplifier circuit according to the comparative example.

FIG. 5 illustrates an equivalent circuit of the power amplifier circuit according to the comparative example. An equivalent circuit of the power amplifier circuit 104 includes inductors $L_1$ and $L_2$, resistors $R_1$ and $R_2$, and capacitors $C_1$ and $C_2$.

The inductor $L_1$ corresponds to an inductance component of the first external power supply line 121b. The resistor $R_1$ corresponds to a resistance component (corresponding to a collector-emitter resistance component during operation, which is a value obtained by dividing a voltage supplied to the collector by a current consumed by the collector) of the transistor 111 (see FIG. 3) as seen from a power supply circuit 103 side. The capacitor $C_1$ corresponds to the capacitor 15.

The inductor $L_2$ corresponds to an inductance component of the second external power supply line 121c. The resistor $R_2$ corresponds to a resistance component (corresponding to a collector-emitter resistance component during operation, which is a value obtained by dividing a voltage supplied to a collector by a current consumed by the collector) of a transistor in the second power amplifier 12 as seen from the power supply circuit 103 side. The capacitor $C_2$ corresponds to the capacitor 16.

As described above with reference to FIG. 4, the inductance value of the first external power supply line 121b and the inductance value of the second external power supply line 121c are substantially the same. That is, an inductance value of the inductor $L_1$ and an inductance value of the inductor $L_2$ are substantially the same. Although it is exemplified that each of the inductance value of the inductor $L_1$ and the inductance value of the inductor $L_2$ is about 2 nH (nanohenrys), the present disclosure is not limited to this.

In general, in power amplifiers connected in multiple stages, the size of a subsequent-stage power amplifier is larger than that of a previous-stage power amplifier. In other words, the number of fingers of the subsequent-stage second power amplifier 12 is larger than that of the previous-stage first power amplifier 11. Hence, a resistance value of the resistor $R_1$ is higher than a resistance value of the resistor $R_2$. Although it is exemplified that the resistance value of the resistor $R_1$ is about 20Ω (ohms), the present disclosure is not limited to this. Although it is exemplified that the resistance value of the resistor $R_2$ is about 4Ω, the present disclosure is not limited to this. Here, the resistance value of the resistor $R_1$ is about five times the resistance value of the resistor $R_2$.

An impedance value of the capacitor $C_1$ is set to a value corresponding to the resistance value of the resistor $R_1$. Similarly, an impedance value of the capacitor $C_2$ is set to a value corresponding to the resistance value of the resistor $R_2$. Hence, the impedance value of the capacitor $C_1$ is higher than the impedance value of the capacitor $C_2$. In other words, an electrostatic capacitance value of the capacitor $C_1$ is lower than an electrostatic capacitance value of the capacitor $C_2$. Since the resistance value of the resistor $R_1$ is about five times the resistance value of the resistor $R_2$, it is exemplified that the impedance value of the capacitor $C_1$ is about five times the impedance value of the capacitor $C_2$. In other words, it is exemplified that the electrostatic capacitance value of the capacitor $C_1$ is about one fifth the electrostatic capacitance value of the capacitor $C_2$. For example, it is exemplified that the electrostatic capacitance value of the capacitor $C_1$ is about 12 pF (picofarads). It is exemplified that the electrostatic capacitance value of the capacitor $C_2$ is about 60 pF.

Figure 6:
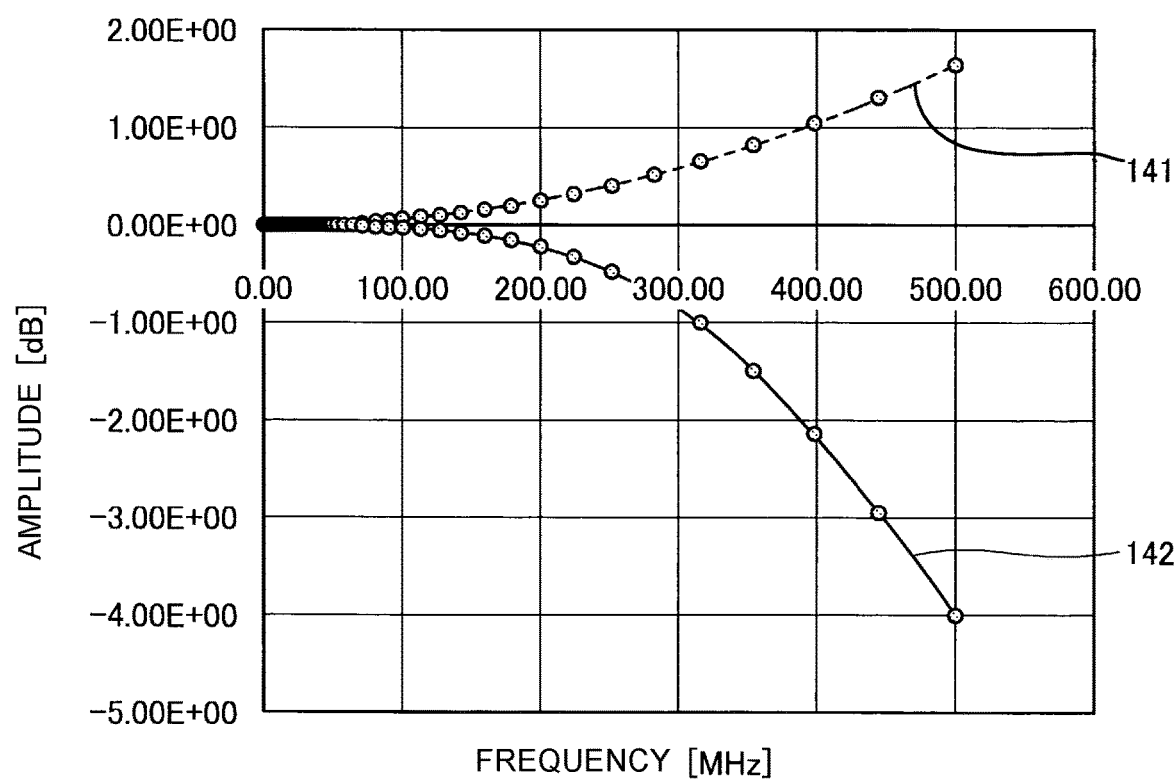
FIG. 6 illustrates circuit simulation results of the equivalent circuit of the power amplifier circuit according to the comparative example.
Figure 7:
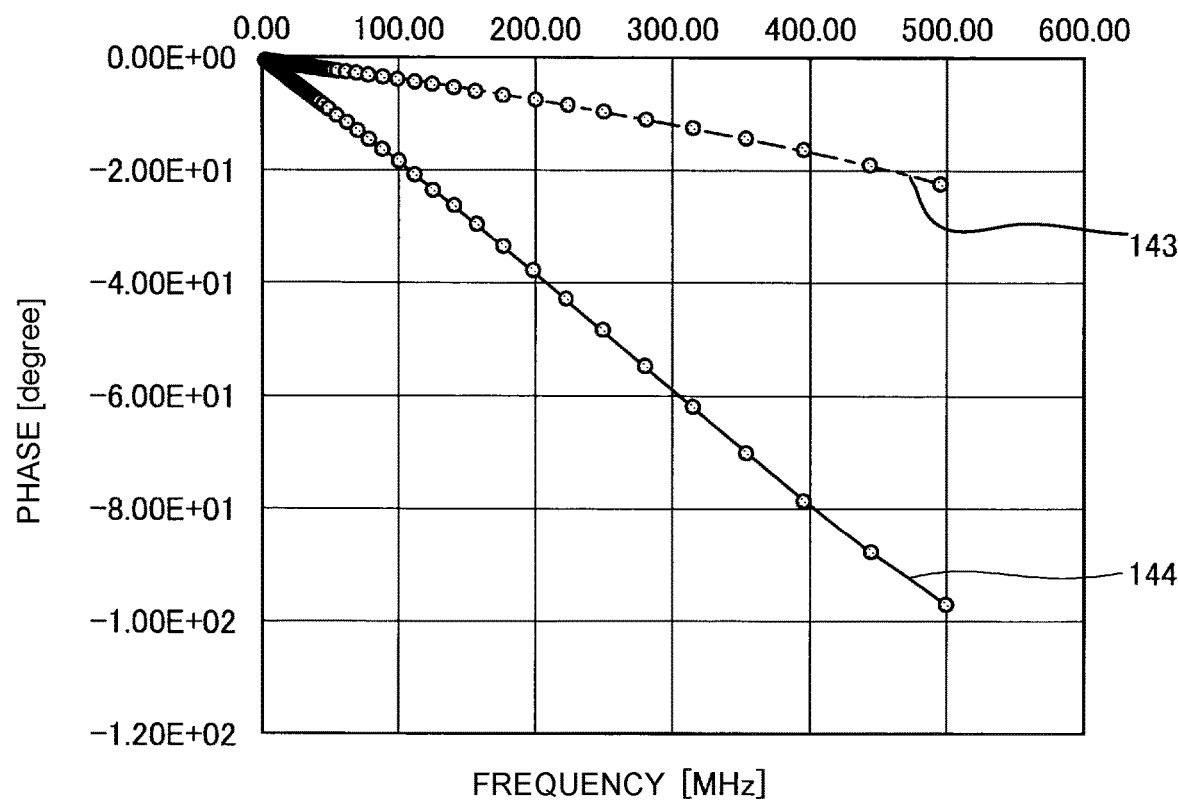
FIG. 7 illustrates circuit simulation results of the equivalent circuit of the power amplifier circuit according to the comparative example.

FIGS. 6 and 7 illustrate circuit simulation results of the equivalent circuit of the power amplifier circuit according to the comparative example. Specifically, FIG. 6 illustrates relationships between a frequency (megahertz (MHz)) of the power supply potential $V_{CC}$ and amplitudes (decibel (dB)) of collector potentials of the first power amplifier 11 and the second power amplifier 12. FIG. 7 illustrates relationships between a frequency (MHz) of the power supply potential $V_{CC}$ and phases (degree) of collector potentials of the first power amplifier 11 and the second power amplifier 12.

In FIG. 6, a waveform 141 represents the amplitude of the collector potential of the first power amplifier 11. A waveform 142 represents the amplitude of the collector potential of the second power amplifier 12. The amplitude represented by the waveform 141 increases from about 100 MHz, whereas the amplitude represented by the waveform 142 decreases from about 100 MHz.

In FIG. 7, a waveform 143 represents the phase of the collector potential of the first power amplifier 11. A waveform 144 represents the phase of the collector potential of the second power amplifier 12. The phase represented by the waveform 143 is delayed by about 4 degrees per about 100 MHz, whereas the phase represented by the waveform 144 is delayed by about 20 degrees per about 100 MHz. In other words, the phase of the collector potential of the first power amplifier 11 is ahead of the phase of the collector potential of the second power amplifier 12.

Thus, in a range of about 100 MHz or more in which a frequency of the power supply potential $V_{CC}$ is asked to be in the 5G, a phase difference between the phase of the collector potential of the first power amplifier 11 and the phase of the collector potential of the second power amplifier 12 increases.

The phase of the collector potential of the first power amplifier 11 and the phase of the collector potential of the second power amplifier 12 do not coincide with each other, thereby resulting in the occurrence of distortion in the high-frequency output signal $RF_{OUT}$.

For example, the case is discussed where the power supply circuit 103 controls the phase of the power supply potential $V_{CC}$ so that the phase of the high-frequency input signal $RF_{IN}$ and the phase of a collector potential of the transistor 111 in the first power amplifier 11 coincide with each other. In this case, the phases of a base potential and the collector potential of the transistor 111 in the first power amplifier 11 coincide with each other, and thus no distortion occur in the high-frequency signal $RF_M$. However, the phase of the high-frequency signal $RF_M$ and the phase of a collector potential of the transistor in the second power amplifier 12 do not coincide with each other. In other words, the phases of a base potential and the collector potential of the transistor in the second power amplifier 12 do not coincide with each other, and thus distortion occurs in the high-frequency output signal $RF_{OUT}$.

Furthermore, for example, the case is discussed where the power supply circuit 103 controls the phase of the power supply potential $V_{CC}$ so that the phase of the high-frequency signal $RF_M$ and the phase of the collector potential of the transistor in the second power amplifier 12 coincide with each other. In this case, the phase of the high-frequency input signal $RF_{IN}$ and the phase of the collector potential of the transistor 111 in the first power amplifier 11 do not coincide with each other. In other words, the phases of the base potential and the collector potential of the transistor 111 in the first power amplifier 11 do not coincide with each other, and thus distortion occurs not only in the high-frequency signal $RF_M$ but also in the high-frequency output signal $RF_{OUT}$.

First Embodiment

Figure 8:
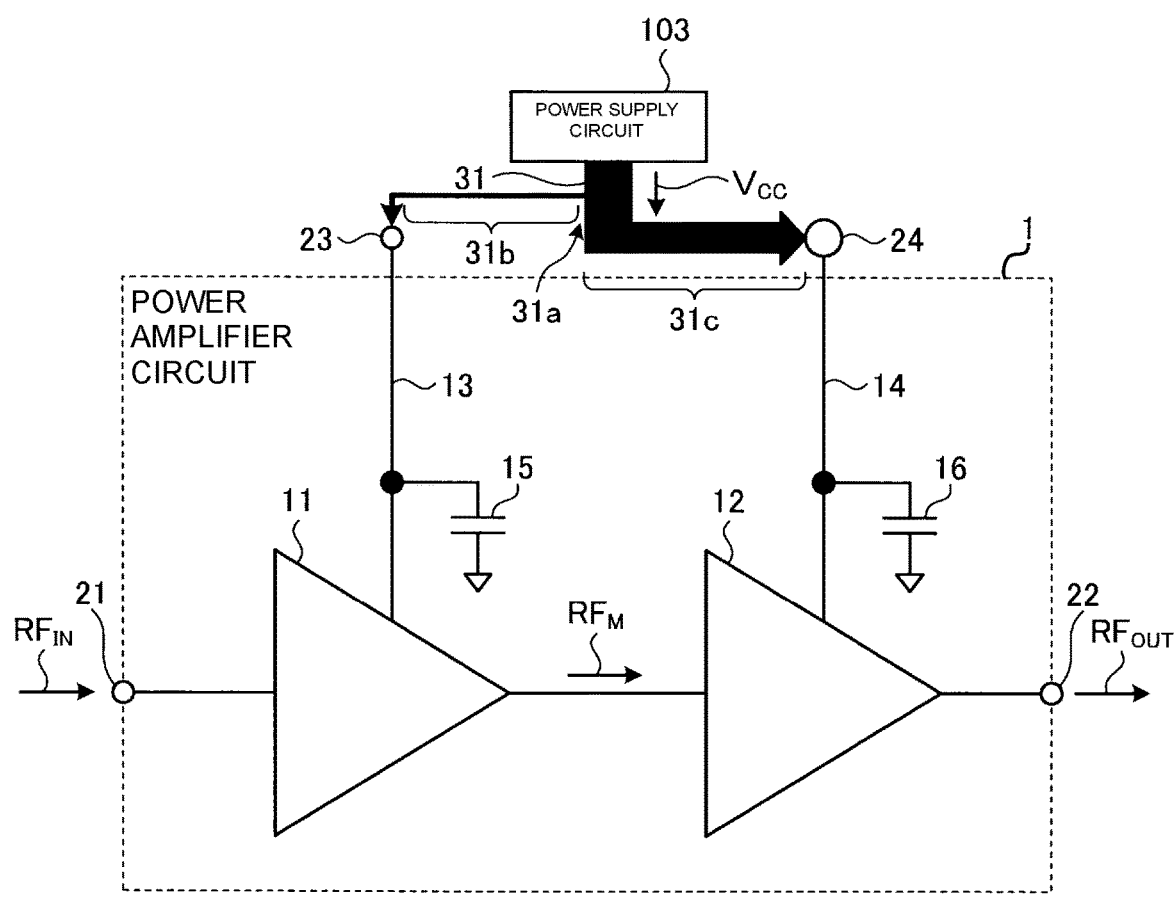
FIG. 8 illustrates a circuit configuration of a power amplifier circuit according to a first embodiment.

FIG. 8 illustrates a circuit configuration of a power amplifier circuit according to the first embodiment.

Of components in a power amplifier circuit 1, components that are the same as those in the power amplifier circuit 104 according to the comparative example are denoted by the same reference numerals, and a description thereof is omitted. Although the power amplifier circuit 1 may be implemented by a hybrid integrated circuit (which may be referred to as a module) in which a plurality of components (semiconductor integrated circuits and so forth) are mounted on one substrate, the present disclosure is not limited to this.

Although the power amplifier circuit 1 includes two stages of power amplifiers that are the first power amplifier 11 and the second power amplifier 12, the present disclosure is not limited to this. The power amplifier circuit 1 may include three or more stages of power amplifiers. For example, the power amplifier circuit 1 may further include one or more power amplifiers inserted between the first power amplifier 11 and the second power amplifier 12.

The power supply circuit 103 is electrically connected to the first power supply terminal 23 and the second power supply terminal 24 using an external power supply line 31. One end of the external power supply line 31 is electrically connected to the power supply circuit 103. The external power supply line 31 is divided into a first external power supply line 31b and a second external power supply line 31c at a branch portion 31a. A tip portion of the first external power supply line 31b is electrically connected to the first power supply terminal 23. A tip portion of the second external power supply line 31c is electrically connected to the second power supply terminal 24.

In this embodiment, although the first external power supply line 31b and the second external power supply line 31c are integrally formed, the present disclosure is not limited to this. The first external power supply line 31b and the second external power supply line 31c may be separately formed and connected together. Furthermore, the first external power supply line 31b and the second external power supply line 31c do not have to be connected together. In other words, each of the other end portion of the first external power supply line 31b and the other end portion of the second external power supply line 31c may be directly connected to the power supply circuit 103.

Figure 9:
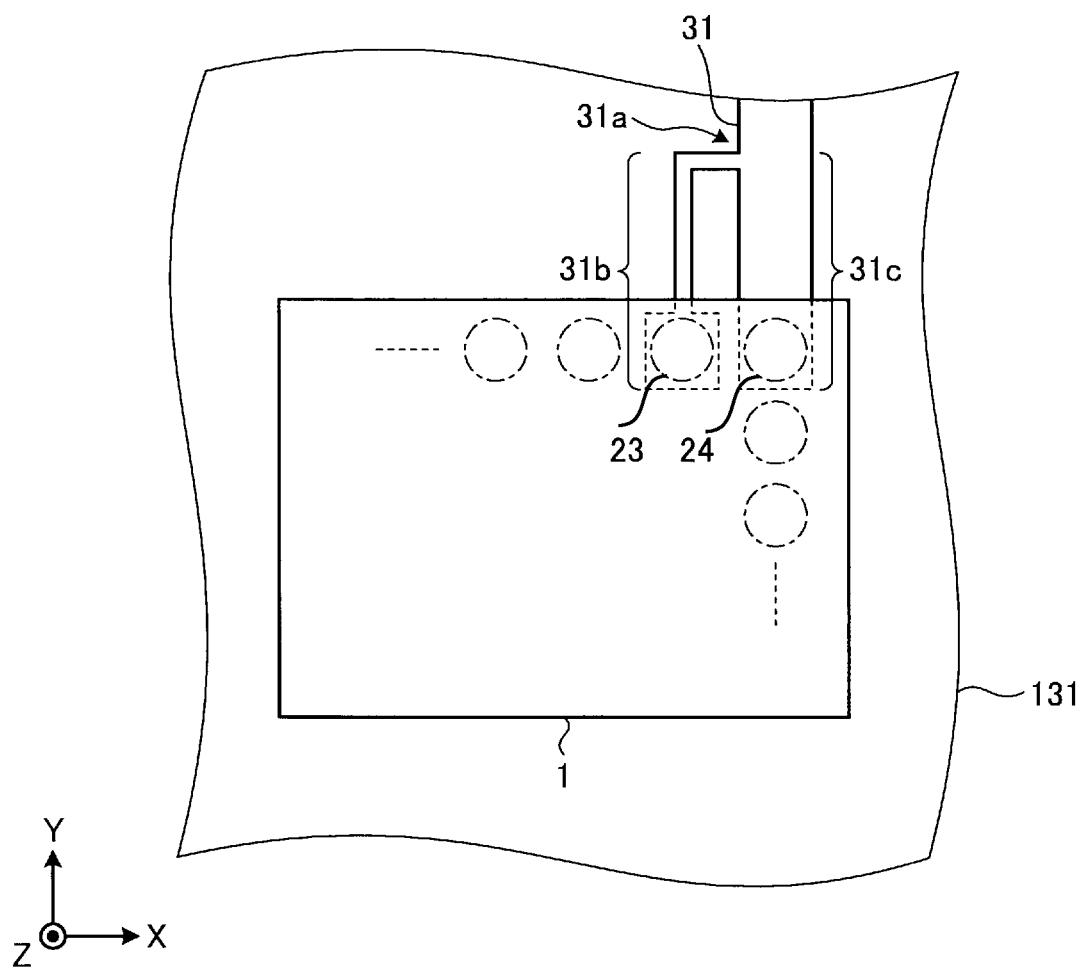
FIG. 9 illustrates the power amplifier circuit according to the first embodiment.

FIG. 9 illustrates the power amplifier circuit according to the first embodiment. Specifically, FIG. 9 illustrates the power amplifier circuit 1 that is a semiconductor integrated circuit (IC) mounted on the substrate 131 as viewed from above.

On the substrate 131, the external power supply line 31 is formed. The external power supply line 31 is divided into the first external power supply line 31b and the second external power supply line 31c at the branch portion 31a.

On a lower surface of the power amplifier circuit 1 (a surface opposite to the substrate 131), the first power supply terminal 23 and the second power supply terminal 24 are provided. The first power supply terminal 23 is electrically connected to the first external power supply line 31b. The second power supply terminal 24 is electrically connected to the second external power supply line 31c.

The width of the first external power supply line 31b is narrower than the width of the second external power supply line 31c. Furthermore, the length of the first external power supply line 31b is longer than the length of the second external power supply line 31c. Hence, an inductance value of the first external power supply line 31b is higher than an inductance value of the second external power supply line 31c.

In general, in power amplifiers connected in multiple stages, the size of a subsequent-stage power amplifier is larger than that of a previous-stage power amplifier. In other words, a collector current of the subsequent-stage second power amplifier 12 is higher than that of the previous-stage first power amplifier 11. Hence, it is desirable to reduce the inductance value of the second external power supply line 31c as much as possible to reduce power loss in the second power amplifier 12. In other words, it is desirable to increase the width of the second external power supply line 31c as much as possible and to reduce the length of the second external power supply line 31c as much as possible.

An equivalent circuit of the power amplifier circuit 1 is the same as the equivalent circuit of the power amplifier circuit 104 (see FIG. 5). Note that an inductance value of the inductor $L_1$ differs from that in the power amplifier circuit 104.

An inductance value of the inductor $L_1$ is set to a value higher than an inductance value of the inductor $L_2$. Although it is exemplified that the inductance value of the inductor $L_1$ is set in accordance with a ratio of a resistance value of the resistor $R_1$ to a resistance value of the resistor $R_2$, and the inductance value of the inductor $L_2$, the present disclosure is not limited to this. For example, it is exemplified that the inductance value of the inductor $L_1$ is set to the product of a ratio of the resistance value of the resistor $R_1$ to the resistance value of the resistor $R_2$ and the inductance value of the inductor $L_2$. Here, the ratio of the resistance value of the resistor $R_1$ to the resistance value of the resistor $R_2$ is about five times. Hence, it is exemplified that the inductance value of the inductor $L_1$ is set to about five times the inductance value of the inductor $L_2$. For example, it is exemplified that, if the inductance value of the inductor $L_2$ is about 2 nH, the inductance value of the inductor $L_1$ is set to about 10 nH.

Figure 10:
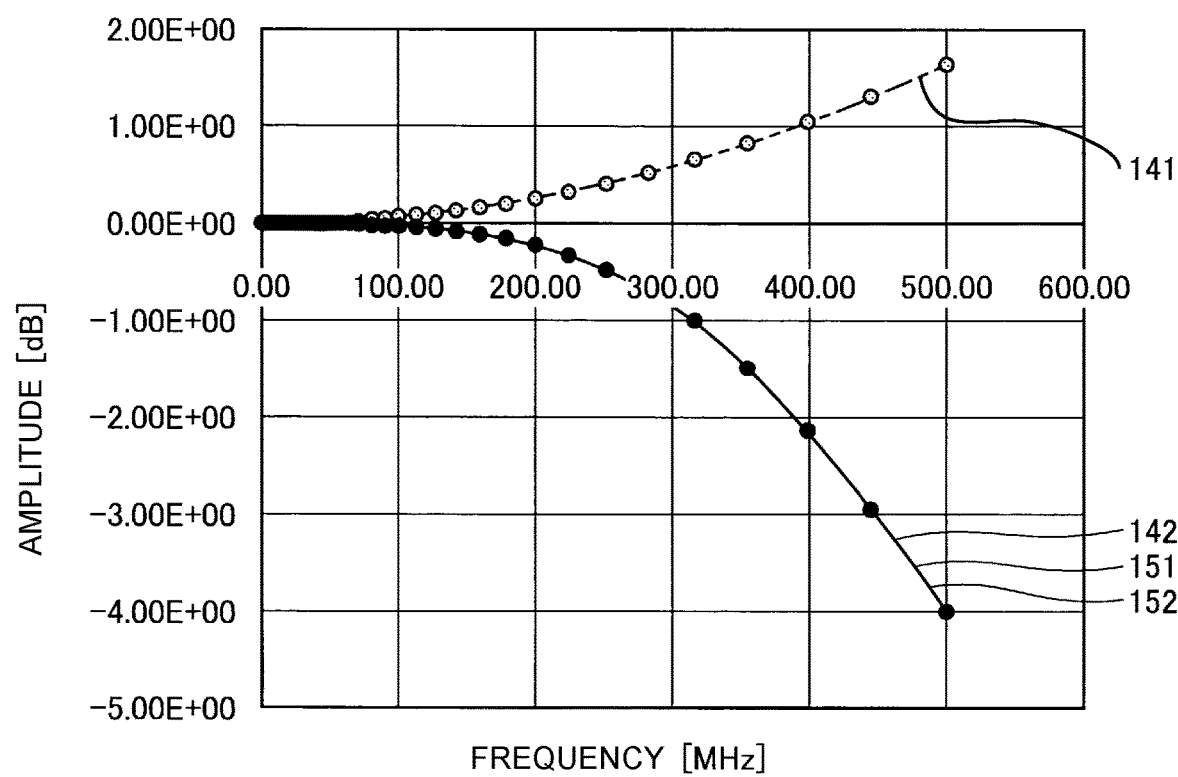
FIG. 10 illustrates circuit simulation results of an equivalent circuit of the power amplifier circuit according to the first embodiment.
Figure 11:
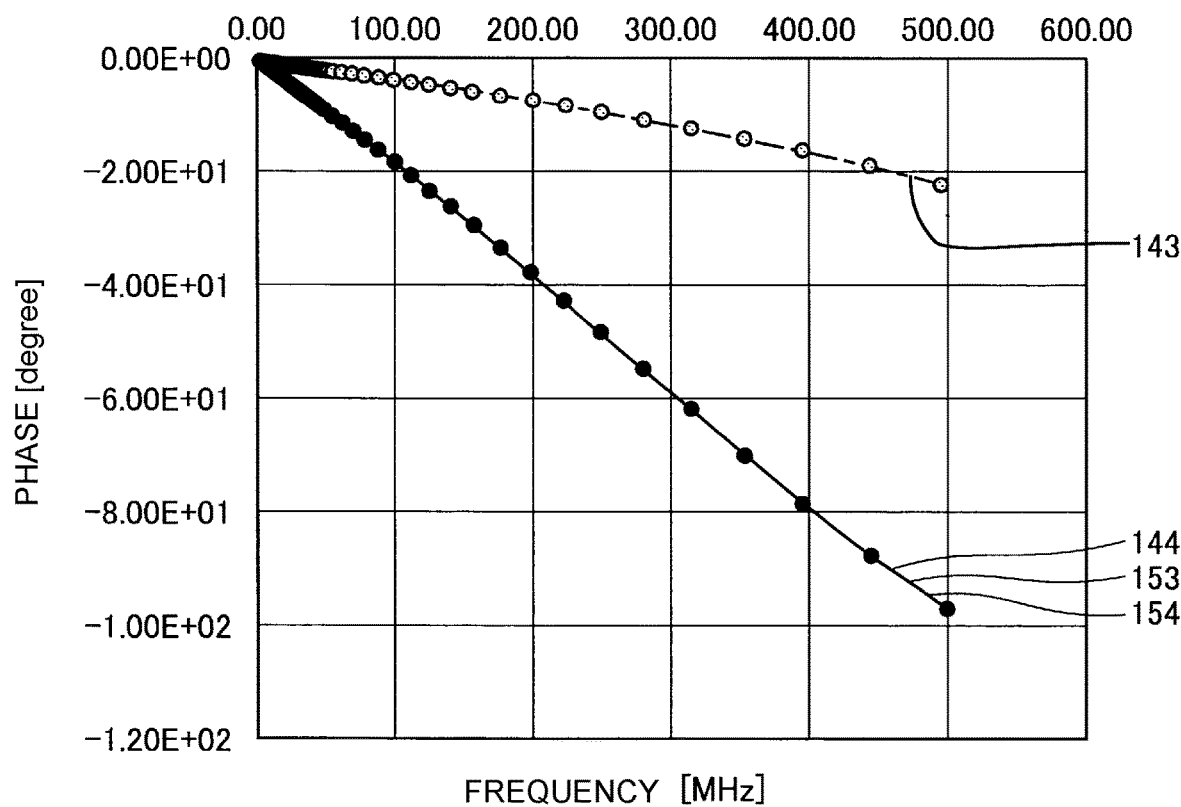
FIG. 11 illustrates circuit simulation results of the equivalent circuit of the power amplifier circuit according to the first embodiment.

FIGS. 10 and 11 illustrate circuit simulation results of the equivalent circuit of the power amplifier circuit according to the first embodiment. Specifically, FIG. 10 illustrates relationships between a frequency (MHz) of the power supply potential $V_{CC}$ and amplitudes (dB) of collector potentials of the first power amplifier 11 and the second power amplifier 12. FIG. 11 illustrates relationships between a frequency (MHz) of the power supply potential $V_{CC}$ and phases (degree) of collector potentials of the first power amplifier 11 and the second power amplifier 12.

In FIG. 10, a waveform 151 represents the amplitude of the collector potential of the first power amplifier 11. A waveform 152 represents the amplitude of the collector potential of the second power amplifier 12. The waveform 142, the waveform 151, and the waveform 152 substantially coincide with one another.

In FIG. 11, a waveform 153 represents the phase of the collector potential of the first power amplifier 11. A waveform 154 represents the phase of the collector potential of the second power amplifier 12. The waveform 144, the waveform 153, and the waveform 154 substantially coincide with one another. In other words, a phase difference between the phase of the collector potential of the first power amplifier 11 and the phase of the collector potential of the second power amplifier 12 is controlled to be substantially zero.

SUMMARY

The power amplifier circuit 1 can reduce a phase difference between the phase of a collector potential of the transistor 111 in the first power amplifier 11 and the phase of a collector potential of the transistor in the second power amplifier 12. Thus, the power amplifier circuit 1 can reduce the possibility that distortion may occur in the high-frequency output signal $RF_{OUT}$.

For example, the case is discussed where the power supply circuit 103 controls the phase of the power supply potential $V_{CC}$ so that the phase of the high-frequency input signal $RF_{IN}$ and the phase of the collector potential of the transistor 111 in the first power amplifier 11 coincide with each other. In this case, the phases of a base potential and the collector potential of the transistor 111 in the first power amplifier 11 coincide with each other, and thus the possibility is reduced that distortion may occur in the high-frequency signal $RF_M$. Furthermore, the phase of the high-frequency signal $RF_M$ and the phase of the collector potential of the transistor in the second power amplifier 12 coincide with each other. In other words, the phases of a base potential and the collector potential of the transistor in the second power amplifier 12 coincide with each other, and thus the possibility is reduced that distortion may occur in the high-frequency output signal $RF_{OUT}$.

Second Embodiment

Figure 12:
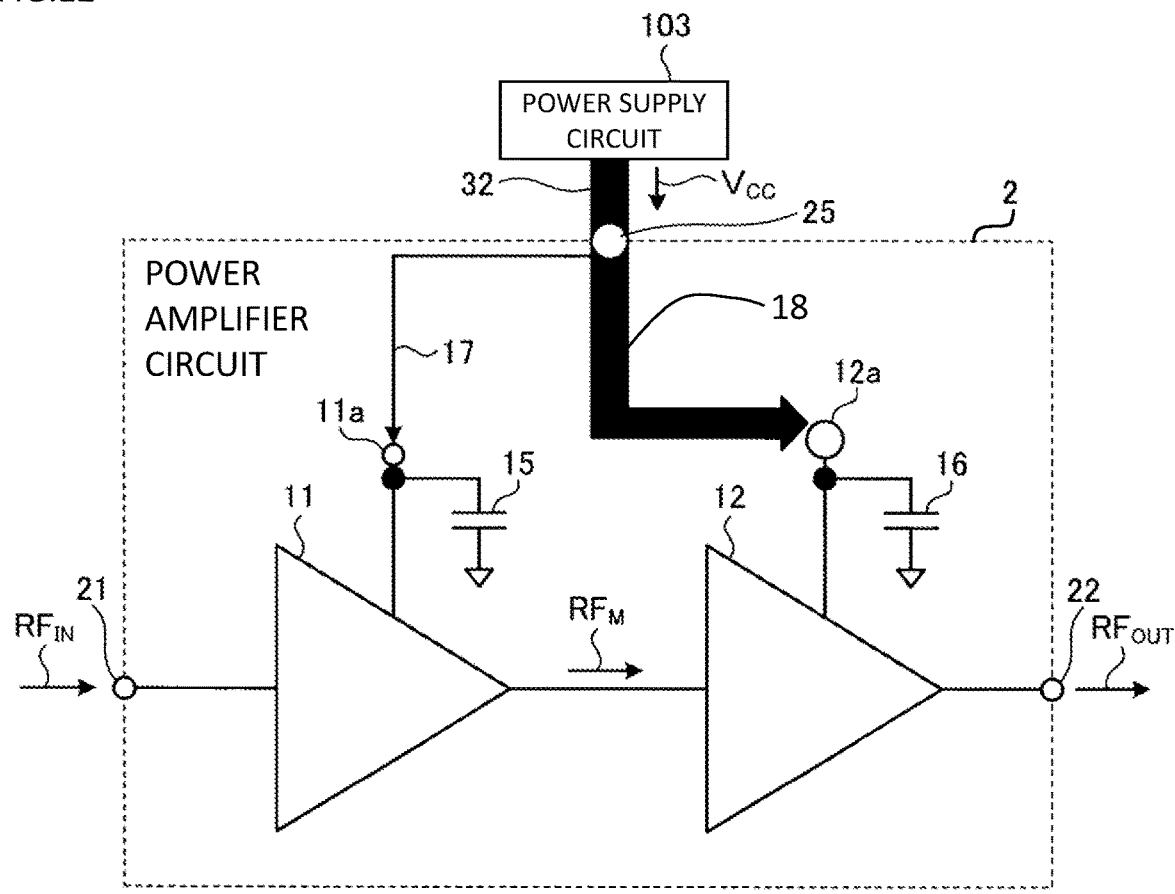
FIG. 12 illustrates a circuit configuration of a power amplifier circuit according to a second embodiment.

FIG. 12 illustrates a circuit configuration of a power amplifier circuit according to a second embodiment.

Of components in a power amplifier circuit 2, components that are the same as those in the power amplifier circuit 1 according to the first embodiment or the power amplifier circuit 104 according to the comparative example are denoted by the same reference numerals, and a description thereof is omitted. Although the power amplifier circuit 2 may be implemented by a hybrid integrated circuit (which may be referred to as a module) in which a plurality of components (semiconductor integrated circuits and so forth) are mounted on one substrate, the present disclosure is not limited to this.

The power supply circuit 103 is electrically connected to a power supply terminal 25 using an external power supply line 32.

One end of a first internal power supply line 17 is electrically connected to the power supply terminal 25. The other end of the first internal power supply line 17 is electrically connected to the first power amplifier 11 (the other end of the inductor 113 (see FIG. 3)). One end of a second internal power supply line 18 is electrically connected to the power supply terminal 25. The other end of the second internal power supply line 18 is electrically connected to the second power amplifier 12.

An equivalent circuit of the power amplifier circuit 2 is the same as the equivalent circuit of the power amplifier circuit 104 (see FIG. 5).

In general, in power amplifiers connected in multiple stages, the size of a subsequent-stage power amplifier is larger than that of a previous-stage power amplifier. In other words, a collector current of the final-stage second power amplifier 12 is higher than that of the first-stage first power amplifier 11. Hence, it is desirable to reduce an inductance value of the second internal power supply line 18 as much as possible to reduce power loss in the second power amplifier 12. In other words, it is desirable to increase the width of the second internal power supply line 18 as much as possible and to reduce the length of the second internal power supply line 18 as much as possible.

An inductance value of the first internal power supply line 17 is set to a value higher than the inductance value of the second internal power supply line 18. Although it is exemplified that the inductance value of the first internal power supply line 17 is set in accordance with a ratio of a resistance value of the resistor $R_1$ to a resistance value of the resistor $R_2$, and the inductance value of the second internal power supply line 18, the present disclosure is not limited to this. For example, it is exemplified that the inductance value of the first internal power supply line 17 is set to the product of a ratio of the resistance value of the resistor $R_1$ to the resistance value of the resistor $R_2$ and the inductance value of the second internal power supply line 18. Here, the ratio of the resistance value of the resistor $R_1$ to the resistance value of the resistor $R_2$ is about five times. Hence, it is exemplified that the inductance value of the first internal power supply line 17 is set to about five times the inductance value of the second internal power supply line 18. For example, it is exemplified that, if the inductance value of the second internal power supply line 18 is about 2 nH, the inductance value of the first internal power supply line 17 is set to about 10 nH.

Various mounting methods for setting the inductance value of the first internal power supply line 17 to a value higher than the inductance value of the second internal power supply line 18 are conceivable. For example, it is considered that the width of the first internal power supply line 17 is made narrower than that of the second internal power supply line 18. Furthermore, it is considered that the length of the first internal power supply line 17 is made longer than that of the second internal power supply line 18.

Figure 13:
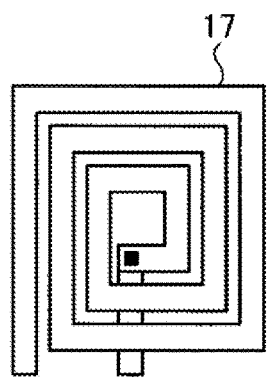
FIG. 13 illustrates an example of a first internal power supply line of the power amplifier circuit according to the second embodiment.

FIG. 13 illustrates an example of the first internal power supply line of the power amplifier circuit according to the second embodiment. As illustrated in FIG. 13, the first internal power supply line 17 may be wound in a helical fashion. This can make the length of the first internal power supply line 17 longer even in a situation in which a region is restricted, and thus the inductance value of the first internal power supply line 17 can be increased.

Furthermore, an inductor (component) may be inserted in the first internal power supply line 17.

Figure 14:
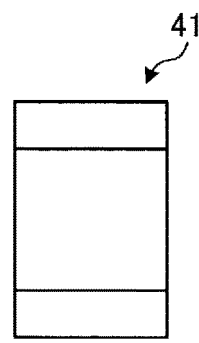
FIG. 14 illustrates an inductor inserted in the first internal power supply line of the power amplifier circuit according to the second embodiment.

FIG. 14 illustrates an inductor inserted in the first internal power supply line of the power amplifier circuit according to the second embodiment. An inductor 41, which is a surface mount device (SMD) illustrated in FIG. 14, may be inserted in the first internal power supply line 17. Thus, the inductance value of the first internal power supply line 17 can be increased.

The power amplifier circuit 2 according to the second embodiment achieves the same effect as the power amplifier circuit 1 according to the first embodiment.

Third Embodiment

Figure 15:
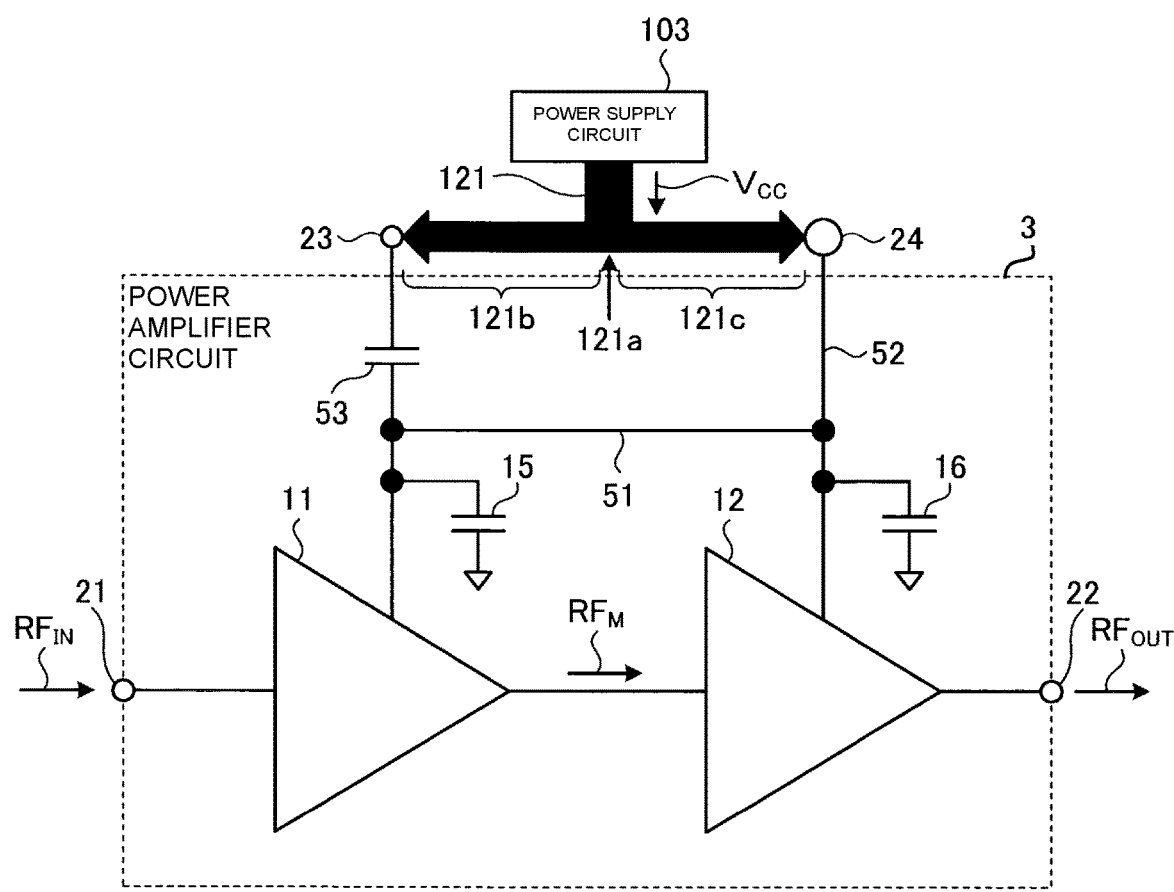
FIG. 15 illustrates a circuit configuration of a power amplifier circuit according to a third embodiment.

FIG. 15 illustrates a circuit configuration of a power amplifier circuit according to a third embodiment.

Of components in a power amplifier circuit 3, components that are the same as those in the power amplifier circuit 1 according to the first embodiment, the power amplifier circuit 2 according to the second embodiment, or the power amplifier circuit 104 according to the comparative example are denoted by the same reference numerals, and a description thereof is omitted. Although the power amplifier circuit 3 may be implemented by a hybrid integrated circuit (which may be referred to as a module) in which a plurality of components (semiconductor integrated circuits and so forth) are mounted on one substrate, the present disclosure is not limited to this.

The power supply circuit 103 is electrically connected to the first power supply terminal 23 and the second power supply terminal 24 using the external power supply line 121. One end of the external power supply line 121 is electrically connected to the power supply circuit 103. On another end side of the external power supply line 121, a division has been made into the first external power supply line 121b and the second external power supply line 121c at the branch portion 121a. A tip portion of the first external power supply line 121b is electrically connected to the first power supply terminal 23. A tip portion of the second external power supply line 121c is electrically connected to the second power supply terminal 24.

One end of a second internal power supply line 52 is electrically connected to the second power supply terminal 24. The other end of the second internal power supply line 52 is electrically connected to the second power amplifier 12. One end of the capacitor 16 is electrically connected to the second power amplifier 12.

In general, in power amplifiers connected in multiple stages, the size of a subsequent-stage power amplifier is larger than that of a previous-stage power amplifier. In other words, a collector current of the subsequent-stage second power amplifier 12 is higher than that of the previous-stage first power amplifier 11. Hence, it is desirable to reduce an inductance value of the second internal power supply line 52 as much as possible to reduce power loss in the second power amplifier 12. In other words, it is desirable to increase the width of the second internal power supply line 52 as much as possible and to reduce the length of the second internal power supply line 52 as much as possible.

One end of a first internal power supply line 51 is electrically connected to the other end of the second internal power supply line 52. The other end of the first internal power supply line 51 is electrically connected to the first power amplifier 11 (the other end of the inductor 113 (see FIG. 3)). One end of the capacitor 15 is electrically connected to the first power amplifier 11 (the other end of the inductor 113).

It is exemplified that an inductance value of the first internal power supply line 51 is set to a value that causes a delay corresponding to a phase difference between the waveform 143 and the waveform 144 illustrated in FIG. 7. Thus, the power amplifier circuit 3 enables the phase of a collector potential of the first power amplifier 11 and the phase of a collector potential of the second power amplifier 12 to coincide with each other.

Incidentally, the inductance value of the first internal power supply line 51 exceeds a design value (set value) and becomes too high in actuality, and there is a possibility that the phase of a collector potential of the transistor 111 in the first power amplifier 11 may actually lag behind the phase of a collector potential of the transistor in the second power amplifier 12. Thus, the power amplifier circuit 3 desirably further includes a capacitor 53 between the first power amplifier 11 (the other end of the inductor 113 (see FIG. 3)) and the first power supply terminal 23. The capacitor 53 functions as a feed-forward capacitor and plays a role in compensating for a delay in the phase (in advancing the phase) of the collector potential of the transistor 111 in the first power amplifier 11.

Figure 16:
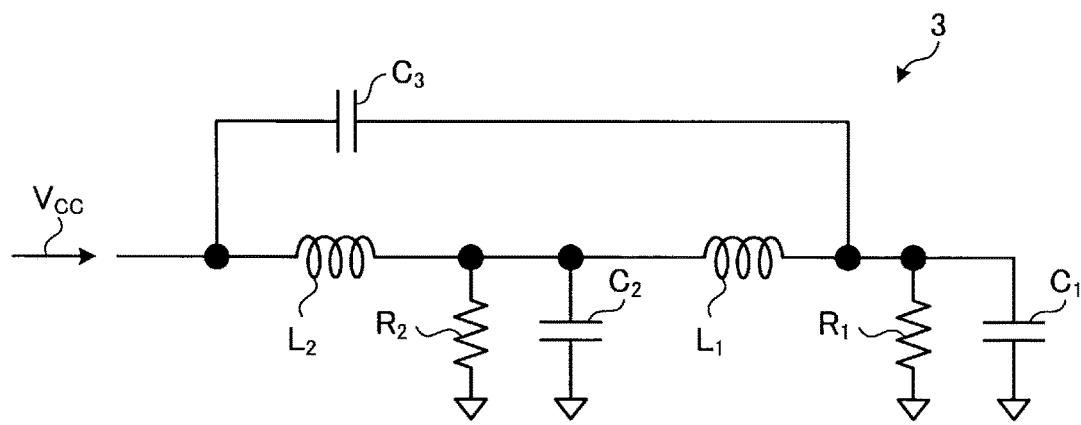
FIG. 16 illustrates an equivalent circuit of the power amplifier circuit according to the third embodiment.

FIG. 16 illustrates an equivalent circuit of the power amplifier circuit according to the third embodiment. An equivalent circuit of the power amplifier circuit 3 includes the inductors $L_1$ and $L_2$, the resistors $R_1$ and $R_2$, and capacitors $C_1$, $C_2$ and $C_3$.

The inductor $L_2$ corresponds to an inductance component of the second internal power supply line 52. The inductor $L_1$ corresponds to an inductance component of the first internal power supply line 51. The capacitor $C_3$ corresponds to the capacitor 53.

The power supply potential $V_{CC}$ is not only transmitted to the resistor $R_1$ (corresponding to the first power amplifier 11) through the inductor $L_2$ and $L_1$ but also transmitted (fed forward) to the resistor $R_1$ through the capacitor $C_3$.

In the power amplifier circuit 3, the one end of the first internal power supply line 51 is electrically connected to the other end of the second internal power supply line 52, thereby making it possible to reduce a phase difference between the phase of the collector potential of the transistor 111 in the first power amplifier 11 and the phase of the collector potential of the transistor in the second power amplifier 12. Hence, the power amplifier circuit 3 can reduce the possibility that distortion may occur in the high-frequency output signal $RF_{OUT}$.

The power amplifier circuit 3 further includes the capacitor $C_3$ and thereby can adjust the phase of the collector potential of the transistor 111 in the first power amplifier 11. Thus, the power amplifier circuit 3 can reduce further a phase difference between the phase of the collector potential of the transistor 111 in the first power amplifier 11 and the phase of the collector potential of the transistor in the second power amplifier 12. Hence, the power amplifier circuit 3 can reduce further the possibility that distortion may occur in the high-frequency output signal $RF_{OUT}$.

The above-described embodiments are intended to facilitate understanding of the present disclosure but are not intended for a limited interpretation of the present disclosure. The present disclosure can be changed or improved without departing from the gist thereof and encompasses equivalents thereof.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. A power amplifier circuit comprising:
   a plurality of power amplifiers connected in multiple stages, and configured to amplify a high-frequency input signal and to output an amplified high-frequency output signal;

a first power supply terminal electrically connected to a first power amplifier of the plurality of power amplifiers;

a second power supply terminal electrically connected to a second power amplifier of the plurality of power amplifiers, the second power amplifier being subsequent to the first power amplifier;

a first external power supply line configured to electrically connect a power supply circuit to the first power supply terminal, the power supply circuit being configured to output a power supply potential corresponding to an amplitude level of the high-frequency input signal; and a second external power supply line configured to electrically connect the power supply circuit to the second power supply terminal, wherein an inductance value of the first external power supply line is greater than an inductance value of the second external power supply line, or wherein a width of the first external power supply line is narrower than a width of the second external power supply line.

2. The power amplifier circuit according to claim 1, wherein the inductance value of the first external power supply line is greater than the inductance value of the second external power supply line.

3. The power amplifier circuit according to claim 1, wherein the width of the first external power supply line is narrower than the width of the second external power supply line.

4. The power amplifier circuit according to claim 1, wherein:
the inductance value of the first external power supply line is greater than the inductance value of the second external power supply line, and
the width of the first external power supply line is narrower than the width of the second external power supply line.

5. The power amplifier circuit according to claim 1, wherein a length of the first external power supply line is longer than a length of the second external power supply line.

6. The power amplifier circuit according to claim 2, wherein a length of the first external power supply line is longer than a length of the second external power supply line.

7. The power amplifier circuit according to claim 1, wherein:
the inductance value of the first external power supply line is greater than the inductance value of the second external power supply line, and
a length of the first external power supply line is longer than a length of the second external power supply line.

8. A power amplifier circuit comprising:
a plurality of power amplifiers connected in multiple stages, and configured to amplify a high-frequency input signal and to output an amplified high-frequency output signal;
a power supply terminal configured to receive a power supply potential, the power supply potential corresponding to an amplitude level of the high-frequency input signal;
a first internal power supply line configured to electrically connect a first power amplifier of the plurality of power amplifiers to the power supply terminal; and
a second internal power supply line configured to electrically connect a second power amplifier of the plurality of power amplifiers to the power supply terminal, the second power amplifier being subsequent to the first power amplifier,
wherein an inductance value of the first internal power supply line is greater than an inductance value of the second internal power supply line, or
wherein a width of the first internal power supply line is narrower than a width of the second internal power supply line.

9. The power amplifier circuit according to claim 8, wherein the inductance value of the first internal power supply line is greater than the inductance value of the second internal power supply line.

10. The power amplifier circuit according to claim 8, wherein the width of the first internal power supply line is narrower than the width of the second internal power supply line.

11. The power amplifier circuit according to claim 8, wherein:
the inductance value of the first internal power supply line is greater than the inductance value of the second internal power supply line, and
the width of the first internal power supply line is narrower than the width of the second internal power supply line.

12. The power amplifier circuit according to claim 8, wherein a length of the first internal power supply line is longer than a length of the second internal power supply line.

13. The power amplifier circuit according to claim 8, wherein:
the inductance value of the first internal power supply line is greater than the inductance value of the second internal power supply line, and
a length of the first internal power supply line is longer than a length of the second internal power supply line.

14. The power amplifier circuit according to claim 8, further comprising:
an inductor in the first internal power supply line.

15. The power amplifier circuit according to claim 8, wherein:
the inductance value of the first internal power supply line is greater than the inductance value of the second internal power supply line, and
an inductor in the first internal power supply line.

16. A power amplifier circuit comprising:
a plurality of power amplifiers connected in multiple stages, and configured to amplify a high-frequency input signal and to output an amplified high-frequency output signal;
a second power supply terminal configured to receive a power supply potential, the power supply potential corresponding to an amplitude level of the high-frequency input signal;
a second internal power supply line having a first end electrically connected to the second power supply terminal, and a second end electrically connected to a second power amplifier of the plurality of power amplifiers;
a first internal power supply line having a first end electrically connected to the second end of the second internal power supply line, and a second end electrically connected to a first power amplifier of the plurality of power amplifiers, the second power amplifier being subsequent to the first power amplifier;
a first power supply terminal configured to receive the power supply potential; and a capacitor electrically connected between the first power supply terminal and the second end of the first internal power supply line.

\* \* \* \* \*